United States Patent
Zhang

(12) 
(10) Patent No.: US 6,242,363 B1
(45) Date of Patent: Jun. 5, 2001

(54) METHOD OF ETCHING A WAFER LAYER USING A SACRIFICIAL WALL TO FORM VERTICAL SIDEWALL

(75) Inventor: Nan Zhang, Eden Prairie, MN (US)

(73) Assignee: ADC Telecommunications, Inc., Minnetonka, MN (US)

( * ) Notice: Subject to any disclaimer, the term of this patent is extended or adjusted under 35 U.S.C. 154(b) by 0 days.

(21) Appl. No.: 09/372,700

(22) Filed: Aug. 11, 1999

(51) Int. Cl.[7] .................... H01L 21/302; H01L 21/00; H01L 21/76; H01L 29/82

(52) U.S. Cl. .................. 438/739; 438/52; 438/421; 438/735; 257/417

(58) Field of Search ................... 438/381, 149, 438/156, 192, 268, 421, 700, 963, 978, 947, 52, 735, 736, 739; 257/417

(56) References Cited

U.S. PATENT DOCUMENTS

| | | |
|---|---|---|
| 5,018,812 | 5/1991 | Fukuda . |
| 5,110,760 * | 5/1992 | Hsu ................................. 437/180 |
| 5,148,506 | 9/1992 | McDonald . |
| 5,155,778 | 10/1992 | Magel et al. ....................... 385/18 |
| 5,199,088 | 3/1993 | Magel . |

(List continued on next page.)

FOREIGN PATENT DOCUMENTS 0 647 966 A1    4/1995    (EP) .

OTHER PUBLICATIONS

Article entitled "Vertical Mirrors Fabricated by Reactive Ion Etching for Fiber Optical Switching Applications" by Marxer et al., 6 pages., 1997 IEEE.

Document entitled "Folded Beam Structures in Polysilicon Resonators," printed from internet site www.aad.berkeley.edu, Jan. 25, 1999, 3 pages.

Document entitled "'Total MEMS Solutions™', Advanced MicroMachines Incorporated," printed from internet site www.memslink.com, Apr. 26, 1999, 2 pages.

Document entitled "UW–13 MEMS Patent Archive," printed from internet site www.mems.engr.wisc.edu, Oct. 8, 1993, 3 pages.

Document entitled "MEMS Fabrication Capabilities in various institutions and organizations," printed from internet site www.mems.isi.edu, Oct. 8, 1998, 5 pages.

(List continued on next page.)

*Primary Examiner*—Matthew Smith
*Assistant Examiner*—Lex H. Malsawma
(74) *Attorney, Agent, or Firm*—Merchant & Gould P.C.

(57) ABSTRACT

One embodiment of the invention is a method for forming a raised structure on a semiconductor wafer. In the method, a patterned masking layer is formed over a wafer layer. The patterned masking layer typically includes a first mask covering a first region of the wafer layer and at least one side mask adjacent to the first mask, covering a side region of the wafer layer. After forming the patterned masking layer, exposed portions of the wafer layer adjacent the masks are removed using the patterned masking layer. This leaves a first raised structure (relative to an adjacent removed area) in the first substrate region and a sacrificial raised structure in the side region adjacent the first raised structure. After removing the exposed portions of the wafer layer, the sacrificial raised structure is selectively removed while leaving the first raised structure intact. The sacrificial raised structure and overlying side mask typically reduce the area of the wafer layer which would otherwise be exposed during the removal. This facilitates the formation of the vertical sidewall on the raised structure.

22 Claims, 4 Drawing Sheets

U.S. PATENT DOCUMENTS

| | | | |
|---|---|---|---|
| 5,232,866 | * | 8/1993 | Beyer et al. .............................. 437/62 |
| 5,239,599 | | 8/1993 | Harman . |
| 5,345,521 | | 9/1994 | McDonald et al. ...................... 385/19 |
| 5,403,673 | | 4/1995 | Haga et al. . |
| 5,420,067 | * | 5/1995 | Hsu ....................................... 437/180 |
| 5,578,975 | | 11/1996 | Kazama et al. . |
| 5,594,818 | | 1/1997 | Murphy . |
| 5,594,820 | | 1/1997 | Garel-Jones et al. . |
| 5,616,514 | * | 4/1997 | Muchow et al. ........................ 438/50 |
| 5,618,383 | * | 4/1997 | Randall ................................. 430/314 |
| 5,623,564 | | 4/1997 | Presby . |
| 5,623,568 | | 4/1997 | Khan et al. . |
| 5,627,924 | | 5/1997 | Jin et al. . |
| 5,629,993 | | 5/1997 | Smiley . |
| 5,661,591 | | 8/1997 | Lin et al. . |
| 5,684,631 | | 11/1997 | Greywall . |
| 5,706,123 | | 1/1998 | Miller et al. . |
| 5,719,073 | | 2/1998 | Shaw et al. . |
| 5,750,420 | * | 5/1998 | Bono et al. ............................. 438/52 |
| 5,761,350 | | 6/1998 | Koh ........................................ 385/14 |
| 5,774,604 | | 6/1998 | McDonald . |
| 5,778,513 | | 7/1998 | Miu et al. . |
| 5,790,720 | | 8/1998 | Marcuse et al. . |
| 5,808,780 | | 9/1998 | McDonald . |
| 5,814,554 | | 9/1998 | De Samber et al. . |
| 5,863,839 | * | 1/1999 | Olson et al. ........................... 438/695 |

OTHER PUBLICATIONS

Document entitled "Sandia National Laboratories Intelligent Micromachine Initative, MEMS Overview," printed from internet site www.mdl.sandia.gov, Oct. 8, 1998, 7 pages.

Document entitled "Introduction to Microengineering," printed from internet site www.ee.surrey.ac.uk, Oct. 8, 1998, 13 pages.

Article entitled "Microactuated Micro–XYZ Stages for Free–Space Micro–Optical Bench," by Lin et al, 6 pages.

Document entitled "Mems Optical Inc. Micro–Electro–Mechanical Systems," printed from internet site www.memsoptical.com, 10/8/98, 6 pages.

Document entitled "Intelligent Cross–Bar Switch for Optical Telecommunications based on Micro–Mirror Array," printed from internet site dewww.eptl.ch, 10/8/98, 7 pages.

Document entitled "Sandia National Laboratories Intelligent Micromachine Initiative Image Gallery," printed from internet site www.mdl.sandia.gov, 10/8/98, 8 pages.

Document entitled "Sandia National Laboratories Intelligent Micromachine Initiative Technologies: Integrated Trench Technology," printed from internet site www.mdl.sandia.gov, 10/8/98, 3 pages.

Document entitled "MEMS (Micro–Electro–Mechanical–System) Project," printed from internet site www.mcc.com, 10/8/98, 4 pages.

Document entitled "What is MEMS?," printed from internet site www.elvisions.com, 10/8/98, 1 page.

Document entitled "Statement of Work (Exhibit P) MEMS Project to the Research and Development Agreement Sept. 2, 1998," printed from internet site www.mcc.com, 10/8/98, 8 pages.

* cited by examiner

METHOD OF ETCHING A WAFER LAYER USING A SACRIFICIAL WALL TO FORM VERTICAL SIDEWALL

FIELD OF THE INVENTION

The present invention generally relates to semiconductor structures and, more particularly, to methods of etching a semiconductor wafer using a sacrificial wall and structures formed thereby.

BACKGROUND OF THE INVENTION

Semiconductor technology has driven rapid advancements in many disciplines across numerous industries. Semiconductor technology has facilitated the fabrication of highly complex and compact integrated circuit (IC) devices. Semiconductor technology has also facilitated the manufacture of microelectromechanical systems (MEMS). At present, advancements are being made to facilitate the fabrication of MEMS in integrated circuits on a common substrate.

During the fabrication of the above devices, numerous structures are typically formed on a semiconductor wafer. These structures may, for example, be formed on the semiconductor substrate itself or on another layer formed over the semiconductor substrate. As used herein, the term wafer layer will be used to refer to any layer on a semiconductor wafer, including the substrate itself and overlying layers. The structures may include gate electrodes and trenches, commonly found on integrated circuit devices, and mirrors, gears and comb fingers, commonly found on MEM systems.

Many of the structures found on IC devices and MEM systems are deep and narrow and/or narrowly spaced and can benefit from having smooth and/or vertical sidewalls. Narrow structures allow device sizes to be scaled down. Smooth and vertical sidewalls can for example increase the durability and reliability of a structure. This, in turn, can increase the life span of the structure and can increase fabrication yield. Smooth and vertical side walls can also improve the operating characteristics of a structure. For example, smooth and vertical side walls of a mirror can improve the optical transmission properties of an optical switch. As a result, manufacturers continue to seek techniques for improving the smoothness and/or verticality of narrow and deep structures formed on semiconductor wafers.

SUMMAIY OF THE INVENTION

The present invention provides techniques for forming relatively vertical structures on a semiconductor wafer. A vertical structure may be a sidewall of a mirror or actuator beam of a MEMS device, for example.

One embodiment of the invention is a method for forming a raised structure on a semiconductor wafer. In the method, a patterned masking layer is formed over a wafer layer. The patterned masking layer typically includes a first mask covering a first region of the wafer layer and at least one side mask adjacent to the first mask, covering a side region of the wafer layer. After forming the patterned masking layer, exposed portions of the wafer layer adjacent the masks are removed using the patterned masking layer. This leaves a first raised structure (relative to an adjacent removed area) in the first substrate region and a sacrificial raised structure in the side region adjacent the first raised structure. After removing the exposed portions of the wafer layer, the sacrificial raised structure is selectively removed while leaving the first raised structure intact. The sacrificial raised structure and overlying side mask typically reduce the area of the wafer layer which would otherwise be exposed during the removal. This facilitates the formation of the vertical sidewall on the raised structure.

This method may be used to form a structure in a wafer layer, such as a silicon substrate, having an underlying insulating layer. In this case, the method may further include removing exposed substrate regions surrounding the side region to leave the sacrificial raised structure on the insulating layer isolated from the first raised structure. The sacrificial raised structure may then be removed by removing the insulating layer from beneath the sacrificial raised structure, thereby freeing this structure from the substrate. This may, for example, be performed by dipping the semiconductor wafer in an etching solution such that the sacrificial raised feature falls into the etching solution when the underlying insulating layer is sufficiently removed. While the insulating layer may be removed, at least in part, from beneath the first raised structure, the first raised structure may be supported via another portion of the wafer layer under which the insulating layer remains.

A semiconductor wafer, in accordance with an embodiment of the invention, includes a wafer layer defining a structure having a sidewall separated, in a direction normal to the sidewall, from the wafer layer by at least 50 microns and having a verticality of at least 90±0.6 degrees. The verticality is measured with respect to a horizontal plane of the semiconductor wafer.

The above summary of the invention is not intended to describe each illustrated embodiment or every implementation of the invention. The figures in the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
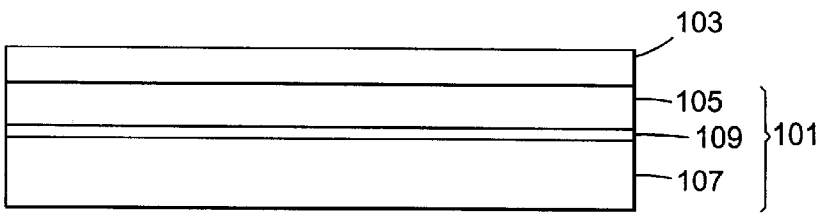
FIGS. 1A–F and 2A–B illustrate an exemplary process in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to the formation of vertical structures, such as sidewalls, on a semiconductor wafer. Aspects of the invention are particularly suited for the formation of vertical sidewalls on MEMS structures and integrated circuit device structures. While the present invention is not so limited, a more thorough understanding of the invention will be gained through the discussion which follows.

The verticality of a sidewall typically depends on the spacing of the sidewall from another structure, if any, in the same general plane. As the spacing increases, sidewall verticality diminishes. Accordingly, a tension exists between increasing sidewall verticality and increasing the spacing adjacent the sidewall. The invention addresses this tension by providing a sacrificial structure adjacent the sidewall (and between the sidewall and any adjacent structure). The sacrificial structure changes the manner in which the wafer layer is attacked by an etchant to improve the verticality of the sidewall. The sacrificial structure may then be removed.

FIGS. 1A–1F and 2A–B illustrate the formation of a vertical structure on a semiconductor wafer. In the example process, a masking layer 103 is formed over a semiconductor substrate 101. The resultant semiconductor wafer is illustrated in FIG. 1A. In this example embodiment, the semiconductor wafer 101 includes an upper wafer layer 105 separated from a lower layer 107 by a buried insulating layer 109. The buried insulating layer 109 may, for example, be formed from an oxide, such as silicon dioxide. The upper and lower wafer layer 105, 107 may be formed from a semiconductor material, such as silicon, for example. The depth of the upper wafer layer 105 can vary depending on the application. In many MEMS applications, its depth is 60 microns or more. In this embodiment, the upper wafer layer has a depth of about 75 microns.

The masking layer 103 will be used as a mask during the removal of exposed portions of the wafer layer 105. The thickness of the masking layer 103 is typically selected in consideration of the desired depth of removal. The masking layer 103 may be formed from a number of materials, including oxides and photoresists, using, for example, known techniques.

In accordance with one particular embodiment, the masking layer 103 is formed from multiple layers of the same photoresist material. For instance, the masking layer 103 may be formed from a double layer of S1818 photoresist. The use of multiple layers of the same photoresist material can allow for patterning of fine features in the masking layer 103, while still providing adequate protection for etching or removing the underlying wafer layer 105 to relatively deep depths. For instance, using a double layer of S1818 photoresist, the wafer layer 105 may be etched to a depth of 75 microns with finely patterned features (e.g., raised feature or trench between raised features having dimensions of 5 microns or less). A more detailed discussion of the application and benefits of a multilayer photoresist mask may be found in application Ser. No. 09/372,428, entitled "Method of Etching a Wafer Layer Using Multiple Layers of the Same Photoresistant Material and Structure Formed Thereby", filed concurrently herewith, the contents of which are herein incorporated by reference.

Figure 1B:
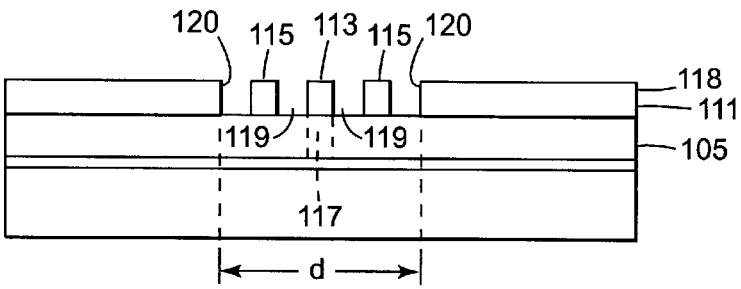
Figure 2A:
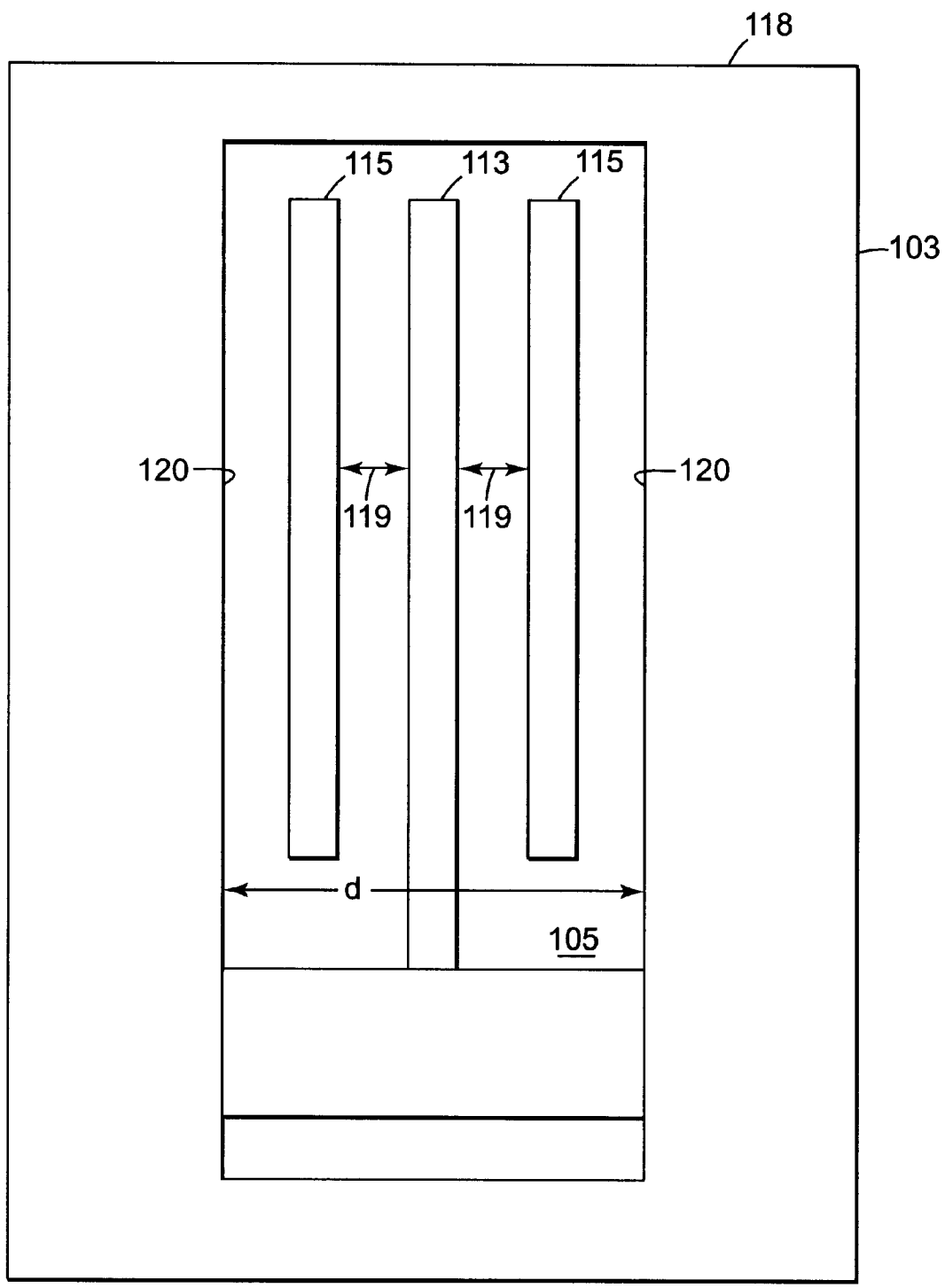

The masking layer 103 is then patterned, as illustrated in FIGS. 1B and 2A. This may be done using, for example, known photolithography techniques. In particular, when using S1818 photoresist, for example, the masking layer 103 may be patterned using acetone rather than ultrasound. The use of acetone can reduce the amount of debris left on the substrate after subsequent processing and improve smoothness of the etched substrate.

In this example, the patterned masking layer 111 (dark) generally exposes areas of the wafer layer 105 (light) to be etched and covers areas of the wafer layer 105 to remain after etching. In the example embodiment, the patterned masking layer 111 includes a first mask 113 covering a wafer layer area 117 in which the desired raised structure 124 is to be formed. The masking layer 111 may further include a second mask portion 118 protecting another area of the wafer layer which will exist in the final structure. In the example, the surrounding second mask portion 118 is used to defining sidewalls of a trench in which the desired raised structure is formed. The distance d between the sidewalls 120 of the surrounding mask 118 generally define the width of the trench in which the raised structure is formed. This distance may, for example, be 80 to 100 microns or more. The raised structure may, for example, lie in the center of the trench.

In conventional etching techniques, the wafer layer 105 would be etched with the wafer layer 105 exposed in its entirety between the first mask 113 and the surrounding mask 118. To facilitate the formation of vertical sidewalls on the raised structure, side mask portions 115 are disposed between the first mask portion 113 and surrounding mask portion 118 for covering areas of the wafer layer 105, adjacent the first wafer layer area 117, in which sacrificial raised structures will be formed. The mask portions 115 will serve to limit the exposed area of the wafer layer 105 adjacent the mask portion 113 during a subsequent removal process. By doing so, the verticality of the walls of the raised structure formed in area 117 can be increased. The distance of the openings 119 between the mask portions 113 and 115 is typically selected to optimize the verticality of the raised structure to be formed in area 117. Opening widths of 10 to 40 microns are suitable for many deep etching applications (e.g., wafer layer depths of 60 microns or more). In the example embodiment, an opening width of 20 microns works particularly well with the removal process discussed below.

The use of a side mask to form a sacrificial structure has been found to be particularly advantageous in application when the distance between two final structures (e.g., a mirror and a trench wall) is about 50 microns or more. The invention is however not so limited. The distance between the first mask and a side mask and the distance between the first mask and a second mask for another desired structure can vary. In some embodiments, such side masks and sacrificial structures may be used where the distance between two remaining end structures is less than 50 microns.

The sacrificial structures which will be formed under the side masks 115 will be removed in later processing. In the example embodiment, the side masks 115 are isolated, i.e., surrounded by exposed portions of the wafer layer 105. In this embodiment, this isolation will allow the sacrificial structure to be removed in an efficient manner.

With the patterned masking layer 111 in place, exposed portions of the wafer layer 105 are removed. This removal process may be performed using a deep reactive ion etch (DRIE) technique. In one embodiment, a standard BOSCH DRIE process is used. This process is typically a 3-step process carried out under the following conditions:

Pressure: 15 m Torr
He Flow: 7.45 sccm (standard cubic centimeters per minute)

Figure 1C:
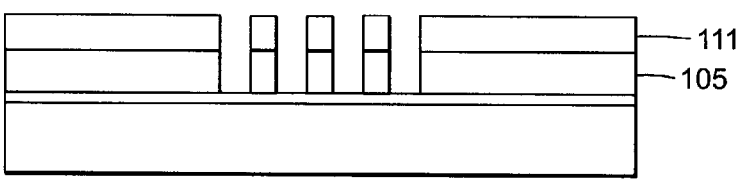
Figure 1D:
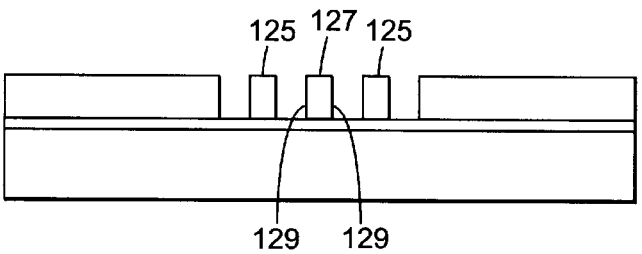

In step 1, $C_4 F_8$ 200 (70 sccm), $SF_6$ 200 (0.5 sccm) and Argon (40 sccm) are flowed for 4 seconds. In step 2, $C_4 F_8$ 200 (0.5 sccm), $SF_6$ 200 (50 sccm) and Argon (40 sccm) are flowed for 3 seconds. In the step 3, $C_4 F_8$ 200 (0.5 sccm), $SF_6$ 200 (100 sccm) and Argon (40 sccm) are flowed for 5 seconds. In an alternate embodiment, the flow time for the first and second steps are increased (to, e.g., 5 seconds and 4 seconds, respectively) and the flow time for the third step is decreased (to, e.g., 3 seconds). This alternative embodiment advantageously provides more vertical sidewalls than the standard BOSCH DRIE process. This removal process typically uses an etchant selective to the insulating layer 109, thereby stopping the etching process on this layer. The resultant structure is shown in FIG. 1C.

The patterned masking layer 111 may then be removed. This may be done using acetone, as noted above. The use of acetone without ultrasound provides particular advantages. For example, this use of acetone can protect fragile structures from vibration damage and can reduce debris left on the wafer layer. The resultant structure, depicted in FIG. 1D, includes a sacrificial structure 125 on each side of a vertical raised structure 127. As a result of the side mask portions 115 and sacrificial structures 125 formed thereunder, the vertical structure 127 formed under masked portion 113 is formed with relatively vertical sidewalls 129. The sidewalls 129 typically have a verticality (relative to a horizontal plane 131 of the semiconductor wafer)of at least 90°±0.6° or better (e.g., 90°±0.5°, 90°±0.4°, 90°±0.3° or better). Using the multilayer photoresist and acetone removal, this procedure can also leave the raised structure 127 with relatively smooth sidewalls (e.g., having a surface roughness of 30 nanometers rms or less). As should be appreciated, the length of the sidewalls depends on the depth of the wafer layer 105 and may, for example, be 60–75 microns.

Following the patterned masking layer removal, portions of the insulating layer 109 are removed. This may be performed by applying an etchant which selectively attacks the insulating layer 109 and leaves the wafer layer 105 intact. During this process, the etchant removes exposed portions of the insulating layer 109 and laterally removes portions of the insulating layer 109 beneath remaining wafer layer 105 structures. Under relatively narrow wafer layer structures, such as the vertical structure 127 and sacrificial structures 125, the underlying insulating layer 109 is sufficiently removed to separate the structures from the substrate 101. Under thicker features, such as under portion 126 of FIG. 2B, the insulating layer 109 while removed slightly at the edges, remains intact, thereby fixing the substrate portion 126 and vertical structure 127 to the substrate 101.

Figure 1E:
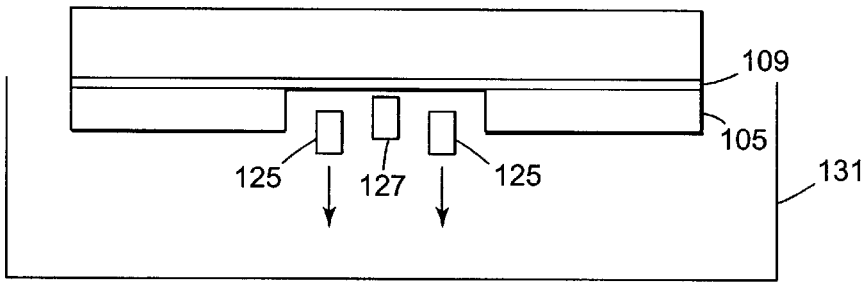

In the example embodiment, this step may be performed by dipping the semiconductor wafer in an etching solution 131 as shown in FIG. 1E. In this manner, the sacrificial structures 125, when released from the underlying insulating layer 109, fall into the etching solution 131. This can occur due to the isolation of these structures. The etching solution may, for example, be a 10:1 solution of hydrochloric acid to water.

Figure 1F:
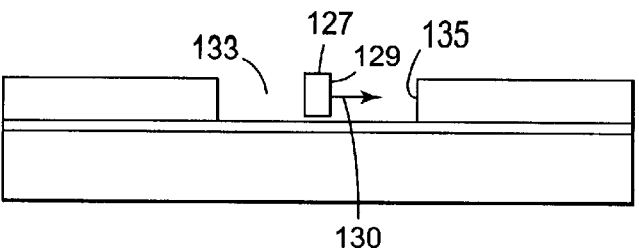
Figure 2B:
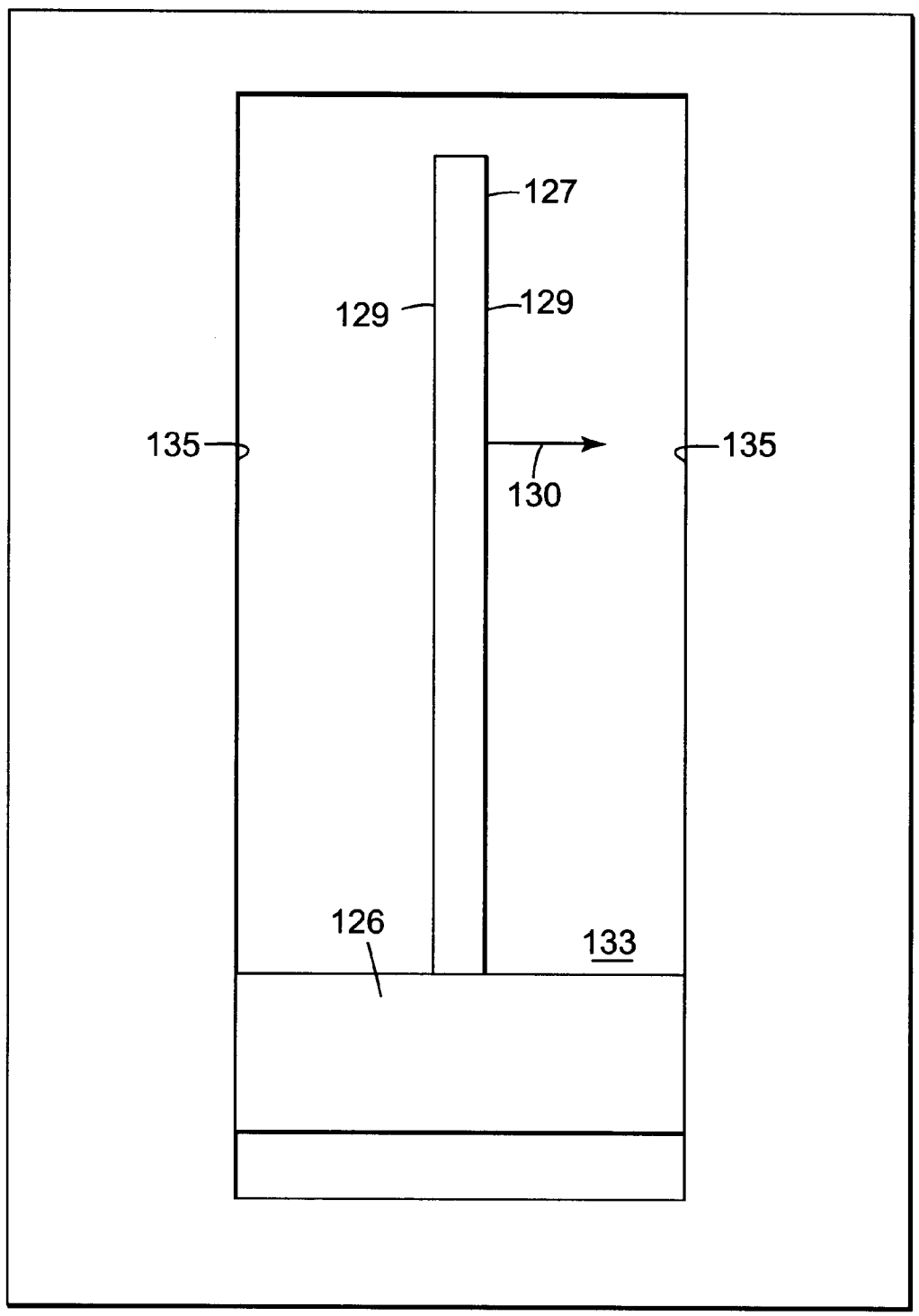

The resultant structure is shown in FIG. 1F. FIG. 2B illustrates a top view of the resultant structure. The structure includes a vertical structure 127 having relatively vertical sidewalls 129 and disposed in a trench 133. The sidewalls 129, in the normal direction 130, are separated from other portions of the wafer layer 105 (e.g., the sidewalls 135 of the trench 133), by a distance of 20 microns or more in this case. While the insulating layer 109 is removed along the length of the vertical structure 127, the vertical structure 127 is supported by substrate portion 126 under which an insulating layer remains.

Using the above process, a structure having one or more vertical sidewalls can be formed, while being separated from an adjacent structure by a large distance (e.g., 50 microns or more). The use of the process finds particular advantages in MEMS technology and application having an underlying layer (e.g., buried insulating layer). For example, the above process may be used to form a mirror wall (vertical raised structure) in a trench (adjacent raised structure). It may also be used to form folded beams (raised structure) of an actuator. U.S. patent application Ser. No. 09/372,265, entitled "Microelectromechanical Optical Switch and Method of Manufacture Thereof," the contents of which are herein incorporated by reference, more thoroughly explains the formation of such MEMS vertical structures.

Figure 3A:
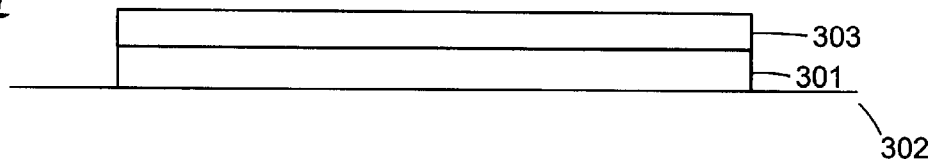
FIGS. 3A–3G illustrate an exemplary process in accordance with another embodiment of the invention.

FIGS. 3A–3G illustrate a process for forming structure with vertical sidewalls in another embodiment. This example process may, for example, be used to form vertical structure in a wafer layer formed over a substrate, such as a gate electrode layer. In this example process, a masking layer 303 is formed over a wafer layer 301, as illustrated in FIG. 3A. The wafer layer 305 may be a polysilicon layer used to form gate electrodes or polysilicon lines, for example. A thin insulating layer 302 may be formed under the polysilicon layer. The masking layer 303 may be formed in a similar manner as discussed above.

Figure 3B:
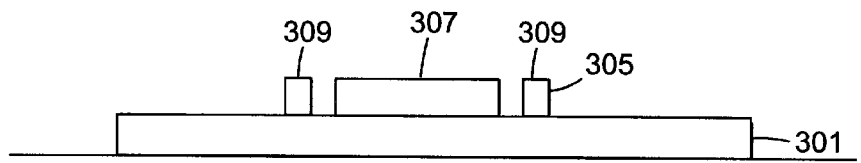

Portions of the masking layer 303 are removed to form a patterned masking layer 305 as shown in FIG. 3B. This may be done using, for example, known photolithography techniques. The patterned masking layer 305 includes a first masked portion 307 covering a region of the wafer layer 301 in which the desired structure, for example, gate electrode, is to be formed. The patterned masking layer 305 further includes one or more side masks 309 spaced from the mask portion 307 for limiting the exposed portions of the wafer layer 301 adjacent the masked portion 307 and increasing verticality of the sidewalls of the structure to be formed. The spacing between the side masks 309 and the mask portion 307 can vary between applications depending on, for example, the desired sidewall verticality and the distance to an adjacent structure, such as another gate electrode.

With the patterned mask 305 in place, exposed portions of the underlying wafer layer 301 are removed. This may be done using, for example, known etching techniques. The resultant structure, depicted in FIG. 3C, includes a vertical structure 311 (e.g., a gate electrode) and two sacrificial structures 313. The side masks 309 and sacrificial structures 313 limit the manner in which the etching solution attacks the wafer layer 301 and thereby increases the verticality of the sidewalls 315 of the resultant structure 311.

Figure 3C:
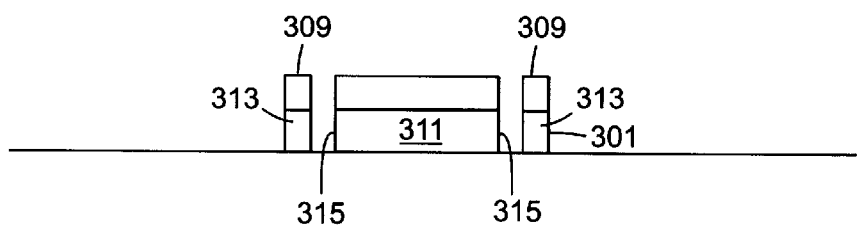
Figure 3D:
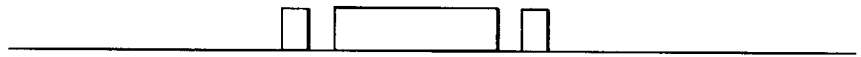
Figure 3E:
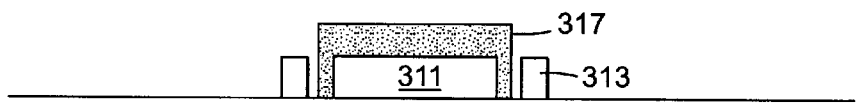
Figure 3F:
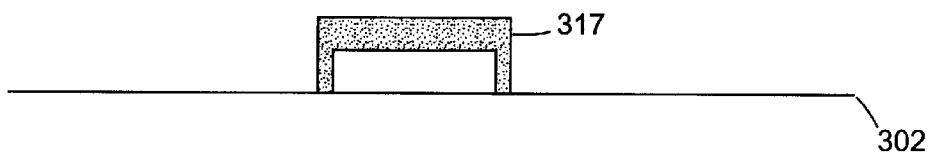
Figure 3G:
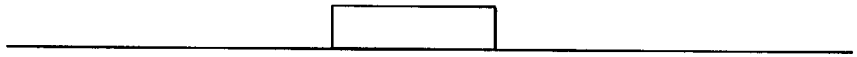

The patterned masking layer 305 is removed, as illustrated in FIG. 3C. A masking layer 317 is then formed to selectively cover the vertical structure 311 and expose the sacrificial structures 313. The resultant structure is illustrated in FIG. 3D. The masking layer 317 may be formed using, for example, known photolithography techniques.

With the masking layer 317 in place, the exposed sacrificial structures 313 are removed. This may be done using known etching techniques, for example. As should be appreciated, the etchant used is typically selective to an underlying layer (e.g., the insulating layer 302) to remove the sacrificial structures 313 while leaving the underlying layer substantially intact. The masking layer 317 may then be removed to form the resultant structure shown in FIG. 3G.

As noted above, the present invention is applicable to a number of techniques for formating vertical structures, such as sidewalls, on a semiconductor wafer. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A method of forming a structure having a vertical sidewall on a wafer layers comprising:

forming a patterned masking layer over the wafer layer, the patterned masking layer including a first mask covering a first region of the wafer layer and at least one side mask adjacent the first mask and covering a side region of the wafer layer;

removing uncovered portions of the wafer layer using the patterned masking layer to leave a first raised structure in the first region of the wafer layer and a sacrificial raised structure in the side region of the wafer layer adjacent the first raised structure; and after removing the uncovered portions of the wafer layer, selectively removing the sacrificial raised structure while leaving the first raised structure intact.

2. The method of claim 1, wherein forming the patterned masking layer includes forming an opening between the first mask and the side mask having a width of 40 microns or less.

3. The method of claim 2, wherein forming the opening includes forming the opening width with a dimension of 20 microns.

4. The method of claim 2, wherein removing uncovered portions of the wafer layer to leave the first raised structure includes forming a gap having a width of 40 microns or less between the first raised structure and the sacrificial raised structure.

5. The method of claim 2, wherein removing uncovered portions of the wafer layer includes leaving the first raised structure with a sidewall having a verticality of at least $90°\pm0.6°$.

6. The method of claim 1, wherein forming the patterned masking layer includes forming and patterning a composite layer of the same photoresist material over the wafer layer and patterning the composite layer.

7. The method of claim 6, wherein forming and patterning the composite layer of the same photoresist material includes:

depositing and heating a first layer of the photoresist material;

depositing a second layer of the photoresist material over the first layer, after heating the first layer, to form a double layer of the photoresist material and heating the double layer of the photoresist material; and patterning the double layer of the photoresist material.

8. The method of claim 7, wherein etching the wafer layer includes forming a trench having a depth of 60 microns or more between the first raised structure and each of the sacrificial raised structure.

9. The method of claim 8, wherein removing uncovered portions of the wafer layer includes forming the first raised structure with a surface roughness of 30 nm rms or less.

10. The method of claim 9, wherein the wafer layer is a layer of a substrate disposed over an insulating layer, wherein removing the uncovered portions of the wafer layer includes removing exposed wafer layer regions surrounding the side region of the wafer layer to leave the sacrificial raised structure on the insulating layer isolated from the first raised structures and selectively removing the sacrificial raised structure includes removing the insulating layer from beneath the sacrificial raised structure, thereby freeing the sacrificial raised structure from the wafer layer.

11. The method of claim 10, wherein selectively removing the sacrificial raised structures includes dipping the wafer layer in an etching solution, wherein the sacrificial raised feature falls into the etching solution.

12. The method of claim 1, wherein forming the patterned masking layer includes forming openings in the patterned masking layer exposing wafer layer regions surrounding the side region.

13. The method of claim 1, wherein selectively removing the sacrificial raised structure includes forming a masking layer selectively masking the first raised structure and removing the sacrificial raised structure using the masking layer.

14. The method of claim 13, wherein removing the sacrificial raised structure using the masking layer includes etching the sacrificial raised structure using the masking layer to keep the first raised structure intact.

15. The method of claim 1, wherein the wafer layer is a layer of a substrate disposed over an insulating layer, wherein removing the uncovered portions of the wafer layer includes removing exposed wafer layer regions surrounding the side region of the wafer layer to leave the sacrificial raised structure on the insulating layer isolated from the first raised structure, and selectively removing the sacrificial raised structure includes removing the insulating layer from beneath the sacrificial raised structure, thereby freeing the sacrificial raised structure from the wafer layer.

16. The method of claim 15, wherein selectively removing the sacrificial raised structures includes dipping the wafer layer in an etching solution, wherein the sacrificial raised feature falls into the etching solution.

17. The method of claim 1, wherein removing uncovered portions of the wafer layer includes leaving the first raised structure with a sidewall having a verticality of at least $90°\pm0.6°$.

18. A method of forming a structure having a vertical sidewall on a wafer layer, comprising:

forming a patterned masking layer over the wafer layer, the patterned masking layer including a first mask covering a first region of the wafer layer and at least one side mask adjacent the first mask and covering a side region of the wafer layer;

removing uncovered portions of the wafer layer using the patterned masking layer to leave a first raised structure in the first region of the wafer layer and a sacrificial raised structure in the side region of the wafer layer adjacent the first raised structure, the sacrificial raised structure being isolated from the first raised structure; and after removing the uncovered portions of the wafer layer, selectively removing the sacrificial raised structure while leaving the first raised structure intact.

19. The method of claim 18, wherein the wafer layer is a layer of a substrate disposed over an insulating layer, wherein removing the uncovered portions of the wafer layer includes removing exposed wafer layer regions surrounding the side region of the wafer layer to leave the sacrificial raised structure on the insulating layer isolated from the first raised structure, and selectively removing the sacrificial raised structure includes removing the insulating layer from beneath the sacrificial raised structure, thereby freeing the sacrificial raised structure from the wafer layer.

20. The method of claim 19, wherein selectively removing the sacrificial raised structures includes dipping the wafer layer in an etching solution, wherein the sacrificial raised feature falls into the etching solution.

21. The method of claim 18, wherein forming the patterned masking layer includes forming a composite layer of the same photoresist material over the wafer layer.

22. The method of claim 18, wherein removing uncovered portions of the wafer layer includes leaving the first raised structure with a sidewall having a verticality of at least $90°\pm0.6°$.

* * * * *